(12) United States Patent
Johnson et al.

(10) Patent No.: US 6,342,848 B1
(45) Date of Patent: *Jan. 29, 2002

(54) SYSTEM FOR DATA DEPENDENT VOLTAGE BIAS LEVEL

(75) Inventors: Luke A. Johnson, Tempe; John K. Schwartzlow, Mesa, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/518,107

(22) Filed: Mar. 3, 2000

Related U.S. Application Data

(63) Continuation of application No. 09/191,075, filed on Nov. 12, 1998.

(51) Int. Cl.$^7$ ............................................. H03M 1/06
(52) U.S. Cl. ............................................. 341/118
(58) Field of Search ................... 341/144, 150, 341/155, 110, 163, 172

(56) References Cited

U.S. PATENT DOCUMENTS 5,661,482 A     8/1997   Shou et al.
6,075,476 A * 6/2000   Johnson et al. ............. 341/144

OTHER PUBLICATIONS

"Performance Consumer Desktop Platform," Sep. '98 Intel Developer Forum, Sep. 1998, pp. 17–29.

* cited by examiner

*Primary Examiner*—Brian Young
(74) *Attorney, Agent, or Firm*—Howard A. Skaist

(57) ABSTRACT

Briefly, in accordance with one embodiment, an integrated circuit includes a circuit to produce discrete output signals that include a multilevel, data dependent voltage bias level, wherein the circuit further includes the capability to at least approximately cancel a zero introduced in the frequency response of the circuit due to capacitive coupling. Briefly, in accordance with another embodiment of the invention, an integrated circuit includes at least one comparator coupled to compare input and output voltage signal levels. The integrated circuit further includes circuitry to signal for an adjustment in the output voltage signal levels based, at least in part, on the comparator output signal.

17 Claims, 6 Drawing Sheets

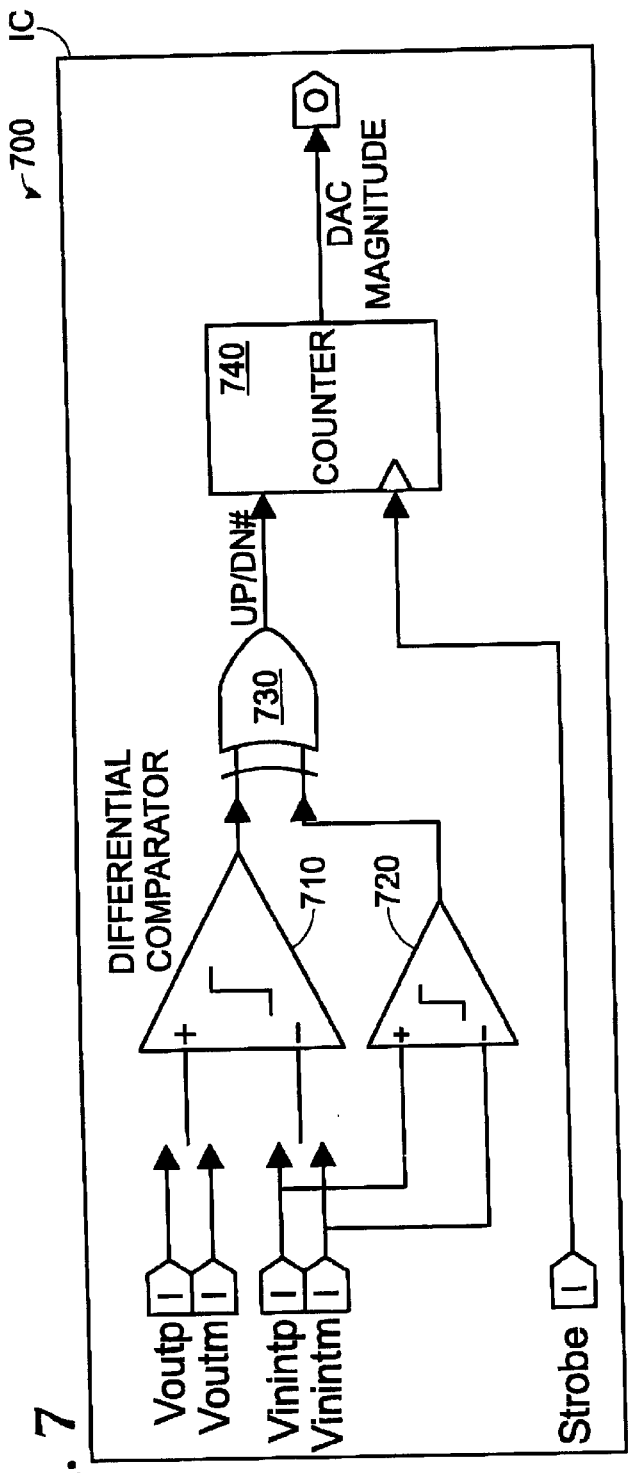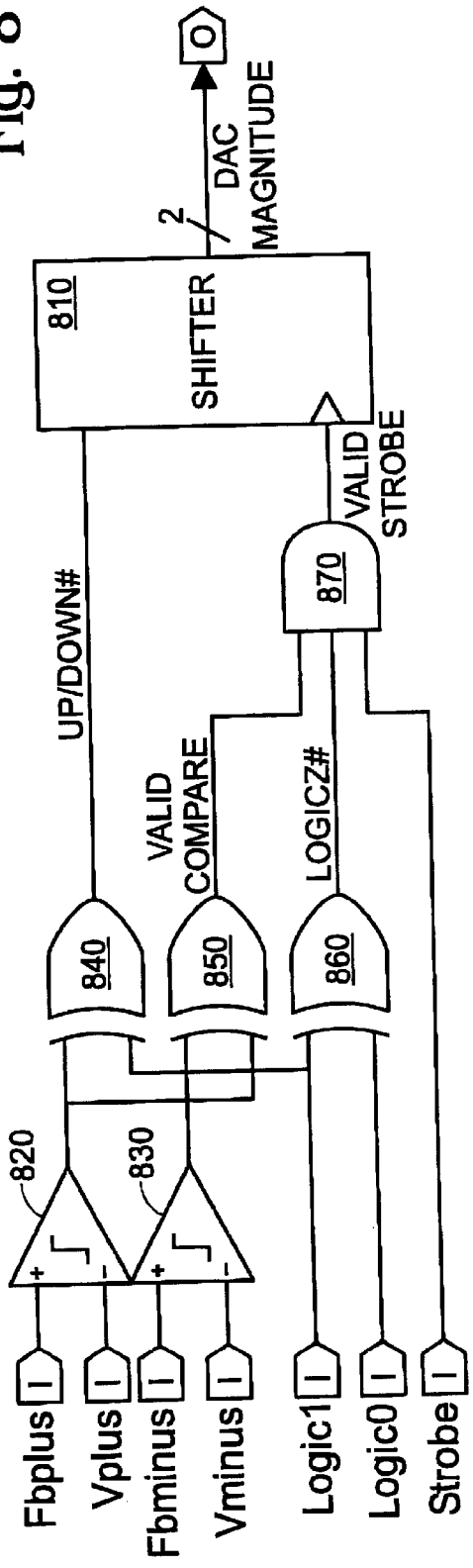

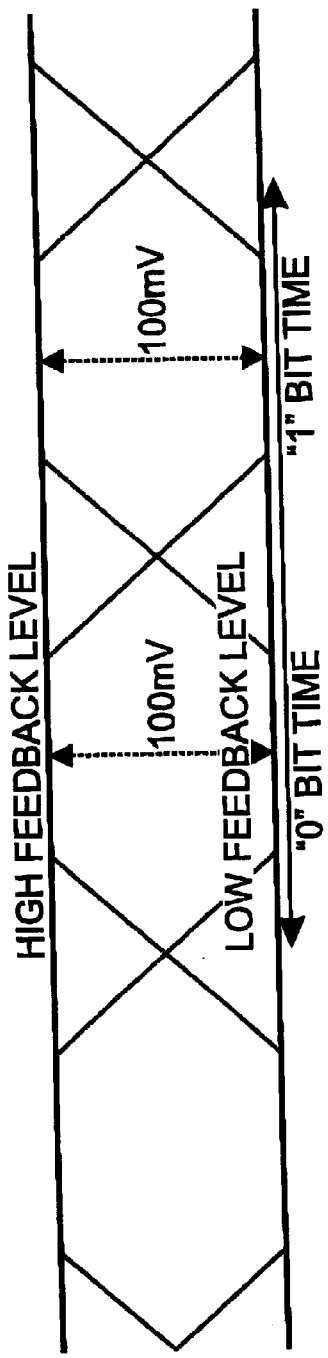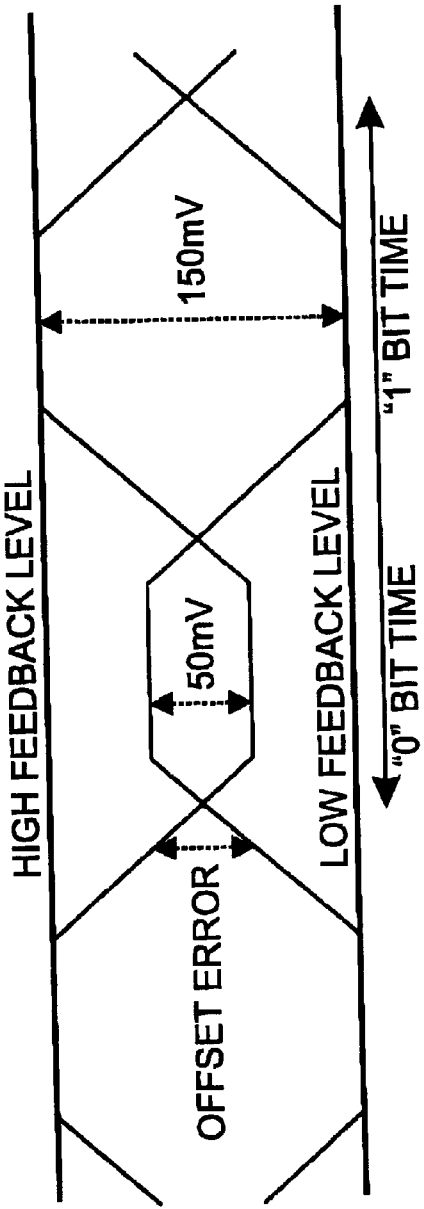
Fig. 11a
Fig. 11b

Fig. 12

| | COMPARATOR 1:<br>\|INPUT\| < \|OUTPUT\| + OFFSET | COMPARATOR 1:<br>\|INPUT\| > \|OUTPUT\| + OFFSET |
|---|---|---|
| COMPARATOR 2:<br>\|INPUT\| < \|OUTPUT\| - OFFSET | OUTPUT SIGNAL MAGNITUDE TOO BIG<br><br>DECREASE \|OUTPUT\| | INVALID STATE |
| COMPARATOR 2:<br>\|INPUT\| > \|OUTPUT\| - OFFSET | MAGNITUDE WITHIN RANGE<br><br>DO NOTHING | OUTPUT SIGNAL MAGNITUDE TOO SMALL<br><br>INCREASE \|OUTPUT\| |

SYSTEM FOR DATA DEPENDENT VOLTAGE BIAS LEVEL

RELATED APPLICATION

This is a continuation patent application of patent application Ser. No. 09/191,075, filed on Nov. 12, 1998, titled "Method and Circuit for Data Dependent Voltage Bias Level," by Johnson et al.

BACKGROUND

1. Field

The invention relates to providing direct-current (DC) isolation for electrical signals.

2. Background Information

As is well-known, a series capacitor, as illustrated in FIG. 2, may be employed to block direct current (DC) voltage levels on a DC balanced signal. In this context, the term "DC balanced" refers to the time average of the signal converging to a DC, fixed signal level that is independent of the data signal values, typically zero volts for differential signaling. This is illustrated in FIG. 2 in which a capacitor 230 is coupled in series with an operational amplifier 210. For the embodiment illustrated in FIG. 2, $V_{bias}$ provides the center point for the signal $V_{int}$.

FIG. 3 illustrates the corresponding signals along a time axis. The biasing scheme operates satisfactorily so long as the signal has an average value independent of data signals. In a system employing binary digital signals, this means a balanced number of "ones" and "zeros." However, in many systems, this balancing of ones and zeros is not assured. For example, although the invention is not limited in scope in this respect, the 1394A protocol specification, Draft 2.0, dated Mar. 15, 1998, available from the Institute of Electrical and Electronic Engineers (IEEE), (hereinafter, "1394A"), does not ensure a balanced number of ones and zeros. Therefore, a long run of zeros may cause the internal node, such as $V_{int}$ in FIG. 2, to drift up to the bias level instead of remaining at the level indicating a "zero." This effect may be more pronounced in multi-level systems, where multiple voltage signal levels are sensed. For example, the 1394A specification employs three logic levels, zero, "z," and one. Therefore, if a long string of zeros were sent, $V_{int}$ would drift up and result in a z being mistakenly interpreted, as illustrated in FIG. 3, for example. A need, therefore, exists to address this shortcoming in such unbalanced systems.

SUMMARY

Briefly, in accordance with one embodiment, an integrated circuit includes a circuit to produce discrete output signals that include a multilevel, data dependent voltage bias level, wherein the circuit further includes the capability to at least approximately cancel a zero introduced in the frequency response of the circuit due to capacitive coupling.

Briefly, in accordance with another embodiment of the invention, an integrated circuit includes at least one comparator coupled to compare input and output voltage signal levels. The integrated circuit further includes circuitry to signal for an adjustment in the output voltage signal levels based, at least in part, on the comparator output signal.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 7 is a circuit diagram illustrating one embodiment of an adaptive voltage biasing control circuit in accordance with the present invention;

FIG. 8 is another embodiment of an adaptive voltage biasing control circuit in accordance with the present invention;

FIGS. 11a and 11b are plots illustrating a voltage offset resulting from voltage mismatch between input signals and output signals; and FIG. 12 is a truth-table illustrating the operation of an alternative implementation of the embodiment illustrated in FIG. 8, that includes a "do nothing" state.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 2:
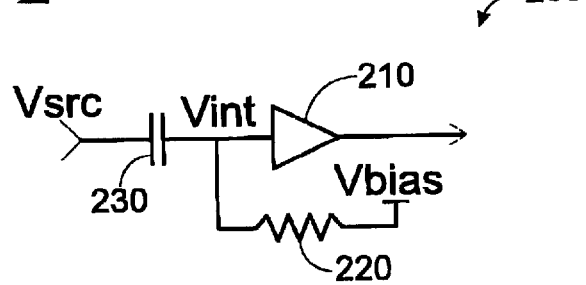
FIG. 2 is a circuit diagram illustrating an embodiment of a typical DC blocking scheme employed at the input port of a comparator.

As is well-known, a series capacitor, as illustrated in FIG. 2, may be employed to block direct current (DC) voltage levels on a DC balanced signal. In this context, the term "DC balanced" refers to the time average of the signal converging to a DC, fixed signal level that is independent of the data signal values, typically zero volts for differential signaling. This is illustrated in FIG. 2 in which a capacitor 230 is coupled in series with a comparator 210. For the embodiment illustrated in FIG. 2, $V_{bias}$ provides the center point for the signal $V_{int}$.

Figure 3:
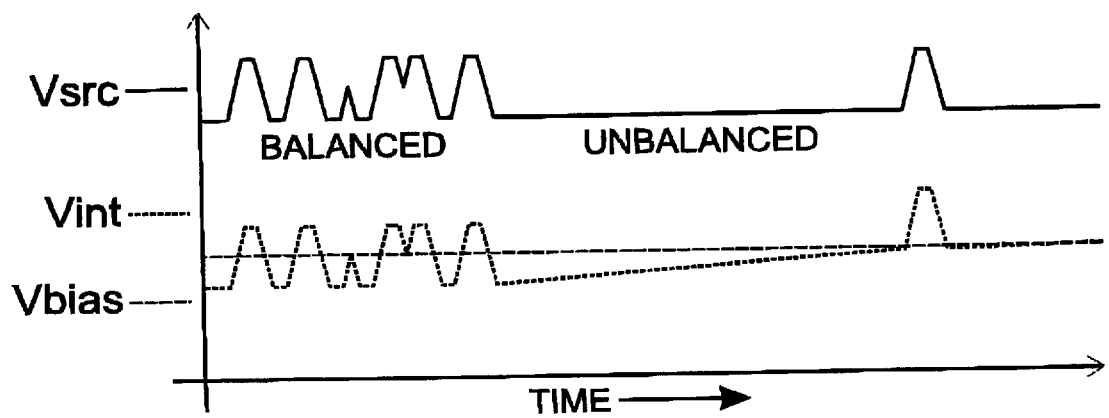
FIG. 3 is a plot illustrating voltage signals that may be produced by the embodiment of FIG. 2.

FIG. 3 illustrates the corresponding signals along a time axis. The biasing scheme operates satisfactorily so long as the signal has an average value independent of the received data signals. In a system employing voltage signals that represent binary digital signals or bits, this means a balanced number of "ones" and "zeros." However, in many systems, this balancing of ones and zeros is not assured. For example, although the invention is not limited in scope in this respect, the 1394A specification protocol, Draft 2.0, dated Mar. 15, 1998, available from the Institute of Electrical and Electronic Engineers (IEEE), (hereinafter, "1394A"), does not ensure a balanced number of ones and zeros. Therefore, a long run of zeros may cause the internal node, such as $V_{int}$ in FIG. 2, to drift up to the bias level indicating a "one," instead of remaining at the level indicating a "zero." This effect may be more pronounced in multi-level systems, where multiple voltage signal levels are sensed. For example, the 1394A specification employs three logic levels, zero, "z," and one. Therefore, if a long string of zeros were received, $V_{int}$ would drift up and result in a z being mistakenly interpreted, as illustrated in FIG. 3, for example.

Figure 4:
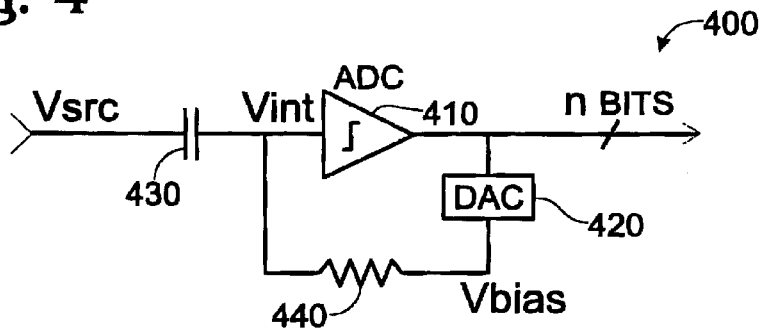
FIG. 4 is a schematic diagram illustrating an embodiment of a circuit that may be employed to produce a data dependent voltage bias level in accordance with the present invention.
Figure 5:
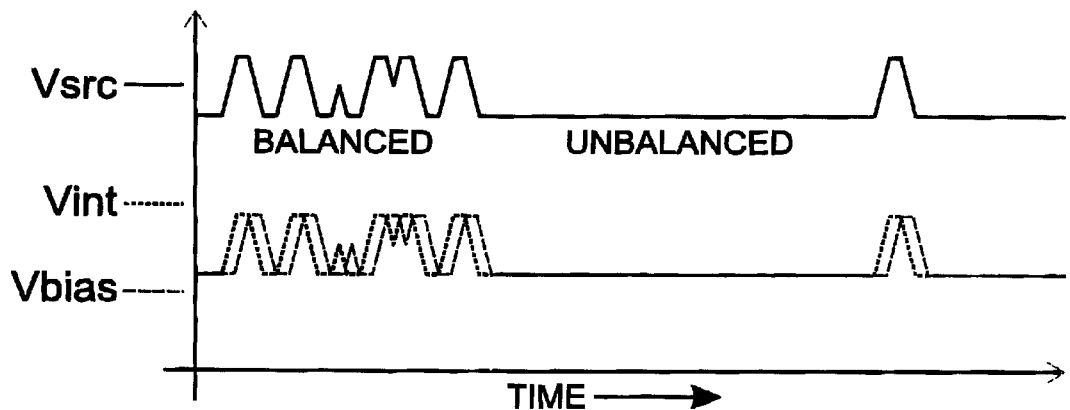
FIG. 5 is a plot illustrating voltage signals that may be produced by the embodiment of FIG. 4.

FIG. 4 is a schematic diagram illustrating one embodiment of a circuit in accordance with the present invention. In this particular embodiment, feedback is employed to provide a data dependent, voltage bias level, that maintains a desired voltage signal level on the internal node, $V_{int}$. In this particular embodiment, the internal node is sampled, employing analog-to digital (A/D) conversion, the digital signal is converted to the corresponding bias level, employing digital-to-analog (D/A) conversion, and the analog voltage value is then maintained on the internal node through a weak driver employed to sustain the desired voltage level. FIG. 5 illustrates corresponding waveforms.

In this particular embodiment, comparator 410 samples node $V_{int}$ providing, as illustrated in FIG. 4, N bits in the form of a digital output signal. This digital output signal is then converted via DAC 420 to a voltage bias and applied to the internal node $V_{int}$ via resistor 440. Of course, as previously indicated, this is a schematic diagram. Any one of a number of specific implementations may be employed to accomplish this result. The waveforms shown in FIG. 5 imply a two-state implementation in which N equals one bit, however, the invention is not limited in scope in this respect. This approach may be applied to a system with any number of bits. Therefore, the case where N equals one is merely provided for purposes of ease of illustration. The figure and waveforms also imply an N-bit binary representation of the feedback state stored on the A/D outputs. It should be noted that a binary representation is not necessary and the state of the feedback may be implemented in thermometer, binary, or any other digital representation of a signal.

Figure 6:
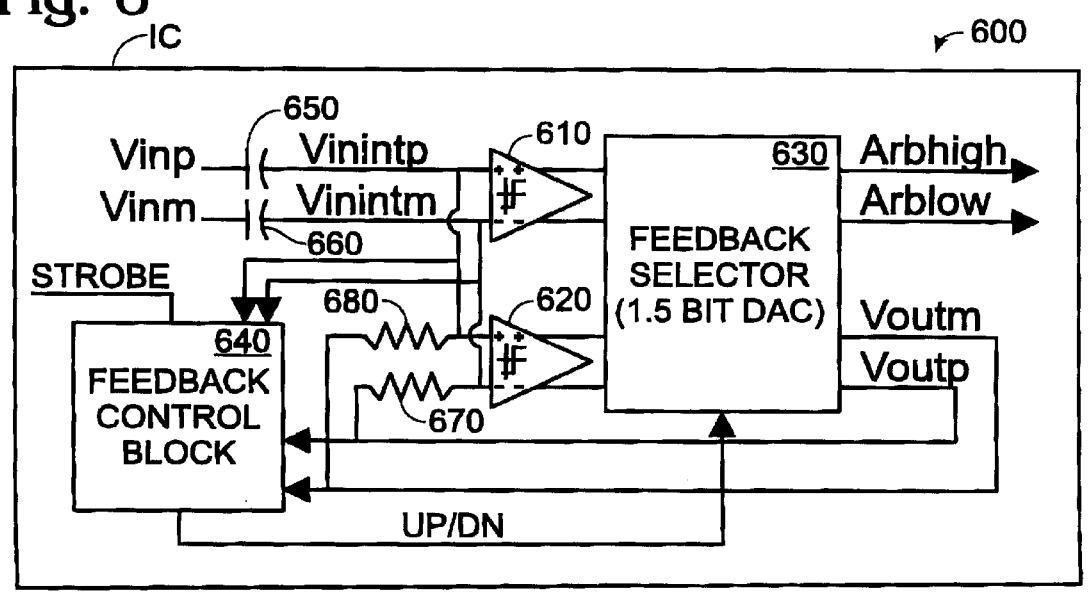
FIG. 6 is a circuit diagram illustrating another embodiment of a circuit that may be employed to produce a data dependent voltage bias level in accordance with the present invention.

FIG. 6 is a circuit diagram illustrating another embodiment in accordance with the present invention. In this particular embodiment, three states are employed, although the invention is not restricted in scope in this respect. This particular embodiment may be employed in a 1394A specification compliant device, system, or component, although, again, the invention is not limited in scope in this respect. Input data signals are applied to the input port of comparator 610 via capacitors 650 and 660. In this particular embodiment, these signals, $V_{inp}$ and $V_{inm}$, are applied differentially. Capacitors 650 and 660 block the DC voltage level signals of $V_{inp}$ and $V_{inm}$. One reason it is desirable in this particular embodiment to block the DC levels of these signals is so that the circuit may be employed in a semiconductor manufacturing process comprising a 1.8 volt process, although again the invention is not limited in scope in this respect. For this circuit to be employed in a 1394A specification compliant system, component, or device, it should tolerate input voltage signals up to 2.7 volts, although a 1.8 volt process may tolerate only up to approximately two volts, typically. Likewise, as previously described, the 1394A specification does not insure DC balanced signals for a simple biasing network, such as illustrated for example in FIG. 2. As illustrated in FIG. 6, the output ports of comparators 610 and 620 drive a feedback selector or DAC 630 that drives the desired voltage onto bias resistors 670 and 680 via signal $V_{outP}$ and $V_{outM}$, produced by selector 630. If the comparators detect a "one" at the input ports, $V_{outP}$ and $V_{outM}$ are driven to a differential level indicating a "one" state. When a "zero" is detected, the signals are driven to the differential level indicate a "zero" state. Likewise, when a "z" state is detected, these signals are driven to the common mode level of the differential signals into the comparators. The resistors, then, hold the differential level, accommodating leakage on the internal nodes $V_{inintp}$ and $V_{inintm}$. This leakage is the result of various parasitic elements (such as reverse bias diodes, gate leakage, etc.) resulting from the actual implementation of the capacitors and comparators. In an ideal environment, there would be no leakage and the $V_{inintp}$ and $V_{inintm}$ would hold their values indefinitely; however, leakage in this embodiment exists to some degree and a mechanism would be desirable to hold (or sustain) voltage levels on capacitors to the desired value that are not otherwise driven. Because a voltage drop appears across the resistors only for a brief time during a transition of state, caused at least in part by the delay in the feedback mechanism, a small amount of current flows onto the internal nodes $V_{inintp}$ and $V_{inintm}$. This current is too small to significantly affect the operation of the circuit and the capacitors nonetheless maintain the desired voltages for an indefinite period of time. The resistances are chosen to have sufficient conductance to oppose leakage on the capacitors while having sufficient resistance to allow $V_{inintp}$ and $V_{inintm}$ to track $V_{inp}$ and $V_{inm}$ during a transition of state.

As illustrated, FIG. 6 also includes feedback control block 640. This block sets the reference voltages for DAC 630. For many applications, a simple DC, fixed voltage reference may be employed, such as a band gap circuit with a resistance ladder, to provide the desired voltage levels. Likewise, in an alternative embodiment, a feedback control block, for example, as described in detail below, may be employed. Of course the invention is not restricted in scope to either of these two embodiments. One advantage of employing a circuit in accordance with the aforementioned patent application for a 1394A specification compliant device, component, or system, is that the input differential has a large range of allowed signal values and an adaptive technique may be employed to accommodate this large range by adjusting its internal reference to match the levels presented by the input signal. However, any embodiment in which the levels have a difference sufficiently equal to the input differential, although the common-mode level may differ, will work. If the levels are not properly set, $V_{inintp}$ and $V_{inintm}$ will drift to this value during a long string of 1's or 0's (or other state in a multi-state system) and may result in an error similar to the unimproved DC blocking scheme in FIG. 2. In fact, in the limiting case where the reference levels approach zero in difference, the system behaves substantially like that of FIG. 2 and no significant improvement is accomplished.

Figure 1:
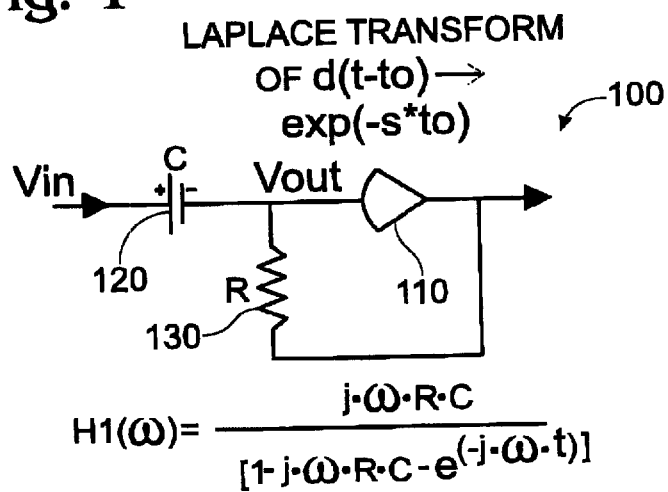
FIG. 1 is a schematic diagram illustrating the frequency domain model of an embodiment of a feedback circuit in accordance with the present invention.

One advantage of the embodiment illustrated in FIG. 6 is the capability to approximately cancel the zero introduced in the frequency response from the bias resistor and input capacitor. FIG. 1 is a schematic diagram illustrating an embodiment of the feedback mechanism employed in accordance with the present invention. In this approach, the addition of a feedback path at least approximately negates the effect of the zero introduced by the capacitor and resistor. In a limiting case, where $T_0$, the delay through the feedback amplifier, approaches zero, as illustrated, the transfer function for this particular embodiment approaches unity. It may also be demonstrated that for a reasonable amount of delay, such as on the order of one nanosecond, the transfer function for this particular embodiment approximates unity, as desired.

Typically, for an approach such as the one illustrated in FIG. 2, as is well-known, the resistor and capacitor should be sufficiently large to place the zero at least two decades below the lowest frequency component in the data stream. This assists in reducing the phase variation induced jitter on the data stream as the frequency approaches the frequency of the zero. In most applications, the capacitor would be located externally, due to its large size, in order to move the zero to a sufficiently low frequency. However, the embodiment illustrated in FIG. 6 accomplishes the desire of approximately canceling the zero so that its frequency is no longer critical. Since the zero is canceled, a higher-frequency zero is tolerable—resulting in smaller capacitor and resistor values. In some designs, such as a 1394A receiver, the capacitor can be on the order of 25 picofarads, which is easily implemented on silicon for an integrated solution. Similarly, the resistor may employ an impedance lower than is traditionally employed, reducing silicon area and system cost. The DAC employed in the embodiment in FIG. 6 typically will not employ a significant amount of silicon and, therefore, should not add significant cost in an integrated circuit embodiment of the invention, such as the one illustrated in FIG. 6.

Therefore, the embodiment illustrated in FIG. 6 provides a technique that enables low voltage digital processes to be employed, while retaining the capability to receive an analog signal with a large common-mode range. This analog signal may be received without harming the part, although the voltage levels employed may exceed the voltage levels for the process employed to fabricate the part. Additionally, a mechanism has been provided for blocking DC voltage levels without substantially compromising bandwidth since the resulting transfer function is very near unity. As processes strive for and achieve lower supply voltages to reduce power and size, such a technique may continue to become more desirable.

Although the invention is not limited in scope in this respect, one issue related to a 1394A compliant receiver includes having the capability to receive data signals from a cable with a large common mode voltage range that, along with the differential input voltage signals, may result in valid voltage levels from approximately 0.5 volts to approximately 2.7 volts, for example. This becomes a challenge particularly with semiconductor manufacturing processes intended for 1.8 volts, which, therefore, may typically tolerate approximately only two volts across a transistor, such as a metal oxide semiconductor (MOS) device. Another issue associated with a 1394 compliant device or system is the use of capacitive direct current (DC) blocking. Data signals provided in a 1394A specification compliant system are not DC-balanced. Therefore, capacitive DC blocking will not result in satisfactory performance. As previously indicated, FIG. 6 illustrates an embodiment of a 1394A compliant receiver that may address such issues. Although the invention is not restricted in scope in this respect, such an embodiment may also employ an embodiment of an adaptive voltage biasing control circuit in accordance with the present invention. This particular embodiment of a 1394A compliant receiver was described in detail previously.

This particular embodiment provides a technique for blocking high common mode voltage levels of a 1394A compliant voltage signal, while reducing symbol dependent jitter components. The data signals are applied differentially at input ports $V_{inp}$ and $V_{inm}$. Series capacitors 650 and 660 provide DC isolation, as desired for a 1.8 volt semiconductor manufacturing processing, and passes non-DC signal components onto differential signal input ports $V_{inintp}$ and $V_{inintm}$. As described in greater detail previously, comparators 610 and 620 determine if the signal applied is a "1" state, a "0" state, or a "z" state, in this particular embodiment. In this particular embodiment, a "z" state occurs if the difference between the signals is within a specified range centered at 0 volts. A "1" state occurs if a difference is above that range and a "0" state occurs if the difference is below that range. Feedback selector or digital-to-analog converter (DAC) 630 produces two binary digital signal or bits, designated $A_{rbhigh}$ and $A_{rblow}$, such as may be applied to a link to a 1394A compliant system, indicating the state of the input signals applied, $V_{inp}$ and $V_{inm}$. Likewise, the selector produces analog differential signals at output ports $V_{outp}$ and $V_{outm}$ at quantized levels essentially identical to those presented at the input ports, $V_{inintp}$ and $V_{inintm}$. Because the DAC output signals are generated from a voltage reference, it has the capability to sustain a desired voltage bias level on $V_{inintp}$ and $V_{inintm}$ for an indefinite period of time.

In this particular embodiment, for satisfactory performance, it is desirable for the differential output signals produced to be substantially equal to the differential input signals applied. This would be desirable in many systems in which the output voltage signals are provided as feedback. However, in the case of the 1394A compliant system, device, or component, this problem is made more difficult because the input levels may vary from approximately 117 millivolts to 260 approximately millivolts, depending on the type and length of the cable, the transmitter and the amount of supply power being delivered by the cable, for example. In this particular embodiment, and in other systems in which the feedback voltage signals are provided for the input voltage signals applied, if the input signals significantly vary from those provided as feedback, this may result in performance degradation. For example, in this particular embodiment, the receiver may end up adding undesirable jitter to the data path, as described in greater detail below. In this context, this is referred to as voltage mismatch, where the voltage level for a "1" state in feedback voltage signals is not the same voltage levels for a "1" state applied as input signals.

Figure 10:
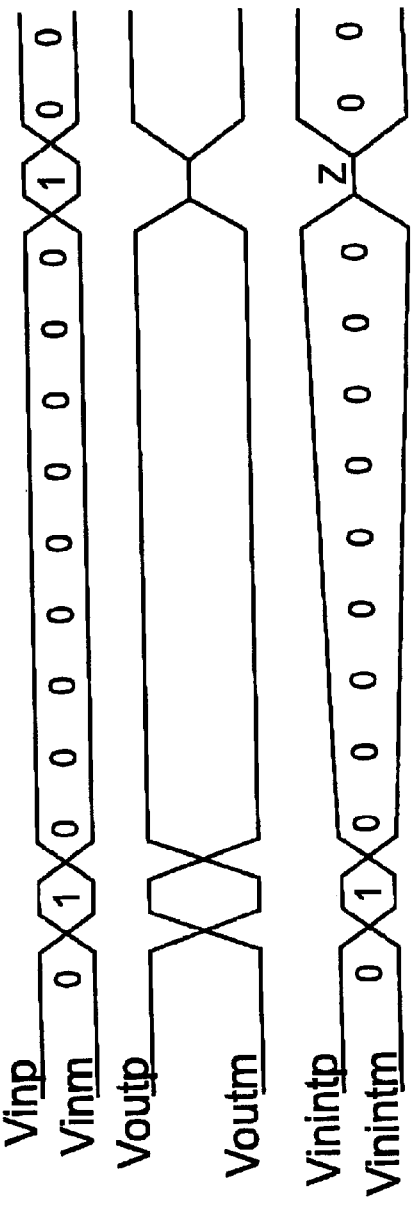
FIG. 10 is a plot illustrating voltage mismatch between input and output voltage signals, such as those that may be respectively applied to and produced by a 1394A specification compliant receiver.

FIG. 10 is a plot illustrating voltage mismatch between the input voltage signals and the output or feedback voltage signals. As illustrated, when data signals become unbalanced, such as after a long string of "ones" or "zeros", the internal nodes, such as for the embodiment illustrated in FIG. 6, achieve voltage levels which may result in jitter or even a missed bit transition. This is illustrated in FIG. 10, for example, where a "one," after a long string of "zeros," is applied, however, the voltage output signals indicate a z state. Likewise, FIG. 11b illustrates how increased jitter may result from even small mismatches in the feedback differential voltage levels. As illustrated in FIG. 11b, where the differential feedback or output signals are not equal to the differential input signals in voltage level, offset error is introduced. As a result, the amount of "0" bit time and "1" bit time is different than for the alternative situation, illustrated in FIG. 11a, in which the output or feedback differential voltage signal levels are substantially equal to the input differential voltage signal levels.

FIG. 7 is a circuit diagram illustrating an embodiment of an adaptive voltage biasing control circuit in accordance with the present invention. This particular embodiment is illustrated on an integrated circuit chip, although the invention is not restricted in scope in this respect. Embodiment 700 includes at least one comparator, such as comparator 710, coupled to compare input and output voltage signal levels. Furthermore, circuitry is included to signal for adjustment in the output voltage signal level based, at least in part, in the comparator output signal, as shall be discussed in more detail hereinafter.

As illustrated in FIG. 7, a counter 740 is coupled to provide a signal to the digital-to-analog converter (DAC). This counter comprises an up/down counter. The digital-to-analog converter (DAC) operates so that when the counter increases, the differential voltage signal level provided by the DAC is increased slightly, whereas when the counter is reduced, the differential voltage signal level produced by the DAC is likewise reduced slightly. As illustrated in FIG. 7, in this particular embodiment, although the invention is not limited in scope in this respect, an up/down signal is provided by an exclusive or (XOR) gate 730. The first input signal provided to gate 730 comprises an output signal provided by a differential comparator 710. As illustrated, comparator 710 compares $V_{inint}$ with $V_{out}$, where the former comprises ($V_{inintp}-V_{inintm}$) and the latter comprises ($V_{outp}-V_{outm}$). If $V_{out}$ is more negative or more positive than $V_{inint}$, then the magnitude of the voltage output or feedback signal (s) produced by the DAC is(are) too high and should be adjusted downward. However, if $V_{out}$ is less negative or less positive, than $V_{inint}$, then it is desirable to adjust the magnitude of the voltage feedback or output signal(s) of the DAC upward. Comparator 720 is employed to determine the sign of the input data signal so that XOR gate 730 may perform an "absolute value" operation. In this particular embodiment, there is no "do nothing" state, but the invention is not limited in scope in this respect. For example, two offset differential comparators may be employed to define a range that is considered "close enough." As illustrated in the truth table in FIG. 12, in this implementation, if both comparator output signals indicate the magnitude is too high, the DAC magnitude is reduced. Likewise, if both comparators indicate the magnitude is too low, then the DAC magnitude is increased. If the comparators indicate the magnitude below a set threshold above the input signal and above a set threshold below the input signal, then a "do nothing" state is indicated. The final or fourth state indicated in FIG. 12 is invalid and should not occur.

For the embodiment illustrated in FIG. 7, a strobe signal is likewise employed. This strobe signal helps ensure a good measurement of the signals is obtained. Typically, a fixed amount of time should be allowed for the DAC to respond to a transition in the applied data signals. During this period of time, there may be a large voltage drop across the resistors, that it might be best to ignore. Therefore, the adaptive circuitry may be set up to wait until the main circuitry has settled sufficiently, before making an up/down determination.

Figure 9:
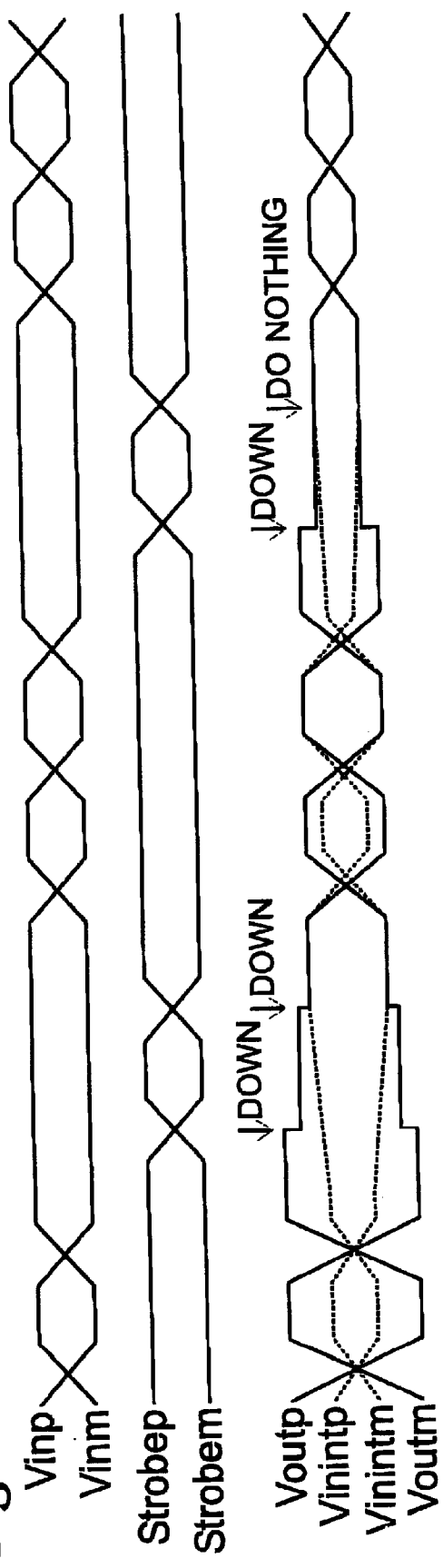
FIG. 9 is a plot illustrating various signals produced by an embodiment of an adaptive voltage biasing control circuit in accordance with the present invention that employs a strobe signal.

In one embodiment, the strobe signal may comprise a delayed data pulse. However, in a 1394A compliant system, an alternative approach is to use transitions on the strobe differential signal pair to adapt the data signal receiver and, similarly, use the data signals to adapt the strobe. The 1394A protocol provides for a second differential signal that provides an edge when the data signal being transmitted comprises a string of like values. The strobe signal may be employed here to update the DAC magnitude, because this indicates that the input signal is stable or unchanging. This aspect of the operation of this particular embodiment is illustrated in FIG. 9. As illustrated in FIG. 9, when the strobe signal transitions, the DAC output signal magnitude is updated. Once the DAC output signal(s), $V_{out}$, and the internal node voltage signal(s), $V_{inint}$ are sufficiently close, no more adjustments are made and the system has completed its adjustment phase. Likewise, as previously indicated, a "do nothing" state may be omitted and still allow this technique to operate satisfactorily, however, the invention is not limited in scope in this respect. Without a "do nothing" state, the DAC magnitude may toggle back and forth between two levels straddling the "ideal" output voltage signal value. With sufficient granularity in the control, the error can be set to a sufficiently low value and made negligible.

FIG. 8 illustrates an alternative embodiment of an adaptive voltage biasing control circuit in accordance with the present invention. In this particular embodiment, instead of a differential comparator, two single-ended comparators are employed. In this particular embodiment, as in the embodiment showed in FIG. 7, a "do nothing" state is not implemented. The embodiment illustrated in FIG. 8 may be demonstrated to implement the following logic:

If ((Fbplus>Vplus) and (Fbminus<Vminus) and (Logic1)) then de crease feedback differential, Else if ((Fbplus<Vplus) and (Fbminus>Vminus) and (Logic1)) then increase feedback differential, Else if (Vplus<Fbplus) and (Vminus>Fbminus) and (Logic0)) then decrease feedback differential, Else if (Vplus>Fbplus) and (Vminus<Fbminus) and (Logic0)) then increase feedback differential, Else indeterminate and do nothing. In this particular embodiment, adjustments to the differential voltage output or feedback signal magnitude are made when the signal voltage levels straddle the input signal voltage levels or when the input signal voltage levels straddle the output or feedback signal voltage levels. In this embodiment, this straddle condition is determined by a "valid compare" signal, as indicated in FIG. 8. If the "valid compare" signal is not active, the strobe signal is invalidated by the logic, and the system waits for the output signal voltage levels to move the input common mode signal voltage levels via feedback and, thereby, create a straddle condition. Therefore, indeterminate conditions are generally transient due, at least in part, to this adaptive operation. Resistors in FIG. 6, 670 and 680 effectively pull the internal voltage nodes to a common mode voltage level established by the DAC, independent of the differential voltage. This common mode signal voltage level results in a straddle condition since the input signals as well as the output signals are centered around or about a common mode. The signals, logic "1" and logic "0", indicated in FIG. 8, are exclusive or'd (XORed) to ensure that the current state of the signal line applied is not a logic "z" state or signal in this particular embodiment. A logic "z" state in this particular embodiment would invalidate the strobe signal. Therefore, a logic "1" signal is XORed with the comparator output signals to determine a proper decision determination to pass to the DAC.

As previously described, this particular embodiment provides a technique that allows a capacitively coupled system to monitor and provide feedback control to a voltage bias to reduce degradation in data transmission. This embodiment may also be employed to allow a low voltage semiconductor process to adapt to a loosely specified input voltage signal level range, while maintaining DC isolation. Furthermore, it may be used where an accurate voltage reference is unavailable to establish or set the voltage bias levels. With adaptive circuitry, such as described in the previous embodiments, variations in the process, supply voltage, or temperature may be compensated. As processes strive for lower supply voltages to reduce power and size, embodiments, such as the previously described, in accordance with the present invention may be employed to allow interfacing to external components, sensors, systems and/or devices.

An embodiment of a method of producing voltage output signals in accordance with the present invention includes the following. As described previously, and illustrated in connection with FIG. 6, for example, in one embodiment, digital output signals, such as produced by a comparator, for example, are sampled. The sampled signals may be converted to a voltage bias level dependent at least in part on the digital output signals sampled, for example, by a DAC, such as DAC 630, for example. These converted signals may then be employed to produce digital output signals have the voltage bias signal as a DC voltage value, such as with comparators 610 and 620, for example. Of course, this embodiment is not limited to the use of particular circuits, such as those illustrated and described previously, in order the implement this particular method. Nonetheless, embodiments may also include three output states, such as one, zero, and "z," as well as differential output voltage signals. Furthermore, the voltage levels produced for the output voltage signals may comply with the 1394A protocol specification, although the invention is not limited in scope in this respect.

While certain features of the invention have been illustrated and described herein, many modifications, substitutions, changes, and equivalents thereof will now occur to those skilled in the art. It is, therefore, to be understood that the appended claims are intended to cover all such modifications and changes as fall within the spirit of the invention.

What is claimed is:

1. A system comprising:
a circuit to produce discrete output signals that include a multilevel, data dependent, voltage bias level, wherein the circuit further includes the capability to at least approximately cancel a zero introduced in the frequency response of the circuit due to capacitive coupling.

2. The system of claim 1, wherein said system comprises a 1394A specification compliant system.

3. The system of claim 2, wherein the 1394A specification compliant system includes a 1394A specification compliant receiver.

4. The system of claim 3, and further comprising a cable coupled to said receiver, said cable having the capability to deliver valid data signals, wherein each of said valid data signals have a voltage level, wherein the voltage level of each of said valid data signals is at least in the range from approximately 0.5 volts to approximately 2.7 volts.

5. The system of claim 1, wherein the system comprises a system capable of being capacitively coupled to monitor and provide feedback control to a voltage bias to reduce degradation in data transmission.

6. The system of claim 1, wherein said circuit includes at least two comparators coupled to a digital-to-analog converter (DAC), said DAC being adapted to provide feedback voltage signals to adjust the voltage bias level of said digital output signals.

7. The system of claim 6, wherein said DAC comprises a 1.5 bit DAC.

8. The system of claim 7, wherein said circuit to produce discrete output signals is adapted to produce a "1" logic output signal, a "0" logic output signal, and a "z" logic output signal.

9. The integrated circuit of claim 8, wherein the form of the logic output signals comprise differential voltage signals.

10. The integrated circuit of claim 8, wherein said circuit is adapted to produce and receive voltage signals that comply with the 1394A protocol specification.

11. The system of claim 6, and further comprising:
another comparator coupled to compare input and feedback voltage signal levels; and circuitry to signal an adjustment in the feedback voltage signal levels based, at least in part, on the another comparator output signal.

12. The system of claim 11, wherein said circuitry to signal an adjustment comprises one of a counter and a shifter.

13. The system of claim 12, wherein the counter comprises an up/down counter.

14. The system of claim 11, wherein the another comparator comprises a differential comparator.

15. The system of claim 11, wherein the another comparator comprises two single-ended comparators.

16. The system of claim 11, wherein said circuitry to signal an adjustment is coupled so as to provide the adjustment signal to said digital-to-analog converter (DAC).

17. The system of claim 16, wherein said circuitry is coupled to provide the adjustment signal to adjust the magnitude of the feedback signals of said DAC.

* * * * *